United States Patent
Adachi

(10) Patent No.: US 7,955,787 B2
(45) Date of Patent: Jun. 7, 2011

(54) PLASMA DISPLAY PANEL MANUFACTURING METHOD

(75) Inventor: Daisuke Adachi, Kyoto (JP)

(73) Assignee: Panasonic Corporation, Osaka (JP)

( * ) Notice: Subject to any disclaimer, the term of this patent is extended or adjusted under 35 U.S.C. 154(b) by 1280 days.

(21) Appl. No.: 10/511,749

(22) PCT Filed: Feb. 23, 2004

(86) PCT No.: PCT/JP2004/002058
§ 371 (c)(1), (2), (4) Date: Oct. 19, 2004

(87) PCT Pub. No.: WO2004/075234
PCT Pub. Date: Sep. 2, 2004

(65) Prior Publication Data
US 2005/0215161 A1    Sep. 29, 2005

(30) Foreign Application Priority Data
Feb. 21, 2003 (JP) .................... 2003-044556

(51) Int. Cl.
G03F 7/20 (2006.01)
(52) U.S. Cl. ........................... 430/394; 430/320
(58) Field of Classification Search .......... 430/394, 430/311, 397
See application file for complete search history.

(56) References Cited

U.S. PATENT DOCUMENTS

| | | | |
|---|---|---|---|
| 5,008,166 A * | 4/1991 | Aoki | 430/7 |
| 2002/0016075 A1 * | 2/2002 | Peng et al. | 438/700 |
| 2002/0195940 A1 * | 12/2002 | Asano et al. | 313/586 |
| 2003/0090205 A1 * | 5/2003 | Kang | 313/582 |
| 2003/0215747 A1 * | 11/2003 | Kim et al. | 430/284.1 |
| 2004/0076889 A1 * | 4/2004 | Huang et al. | 430/5 |

FOREIGN PATENT DOCUMENTS

| | | |
|---|---|---|
| JP | 59-143324 | 8/1984 |
| JP | 5-335196 | 12/1993 |
| JP | 2001-236892 | 8/2001 |
| JP | 2003-162065 | 6/2003 |
| WO | WO 02/19369 A1 | 3/2002 |

OTHER PUBLICATIONS

English translation of JP Publication 2003-162065, Jun. 2003.*
Rieger, M.L. et al. "Image Quality Enhancements for Raster Scan Lithography." Proceedings of SPIE, vol. 922, Optical/Laser Microlithography, Mar. 1988, p. 55-64.*

* cited by examiner

*Primary Examiner* — Kathleen Duda
*Assistant Examiner* — Brittany Raymond
(74) *Attorney, Agent, or Firm* — McDermott Will & Emery LLP

(57) ABSTRACT

The present invention provides a method of manufacturing a PDP that prevents defects due to dust adhering to a photomask, for example, from occurring in a structure of the PDP. In photolithography, exposure is performed twice in a same process, and photomask (22) is moved within an allowable range of displacement in an exposure pattern, between a first and a second exposures. Photomask (22) is exposed twice in total before and after moving photomask (22). Region (21a), an unexposed region due to interruption of dust (22b) attached to photomask (22), can be suppressed, enabling pattern exposure on photosensitive Ag paste film (21) to be favorably performed.

4 Claims, 3 Drawing Sheets

# PLASMA DISPLAY PANEL MANUFACTURING METHOD

TECHNICAL FIELD

The present invention relates to a manufacturing method for forming a structure of a plasma display panel (hereinafter, abbreviated as "PDP") that is known as a large-screen, thin, and lightweight display apparatus.

BACKGROUND ART

A PDP displays images by exciting a phosphor substance with ultraviolet light generated by gas discharge for light emission.

A PDP is roughly classified into the AC type and DC type by driving method, and the surface-discharge type and opposed-discharge type by discharging method.

In terms of moving to finer-resolution, an increase in the screen size, and easiness in manufacturing owing to simplicity of the structure, a PDP nowadays prevails with a three-electrode structure and the surface-discharge type.

A PDP is composed of a front panel and a back panel. The front panel has display electrodes including scanning electrodes and sustain electrodes; a dielectric layer covering the display electrodes; and a protective layer further covering the dielectric layer, on a substrate made of glass or the like. The back panel has a plurality of address electrodes orthogonal to the display electrodes, a dielectric layer covering the address electrodes, and partition walls on the dielectric layer. Arranging the front panel and the back panel facing each other forms a discharge cell at the intercept of the display electrode and the data electrode, where the discharge cell has a phosphor layer therein.

Such a PDP offers high-speed display as compared with a liquid crystal panel. In addition, it features a wide viewing angle, easy upsizing, and a high-quality display owing to its self-luminous property, attracting attention among flat-panel displays. It is widely used in various applications, particularly for a display apparatus in a public place where many people gather, and for enjoying a large-screen image at home.

In a PDP, at least one of a display electrode and address electrode requires a relatively high accuracy in its shape and allocation pitch. Therefore, so-called photolithography is used, where the whole surface of the substrate is coated with a conducting material such as a metallic material, containing a photosensitive material, which is exposed and developed using a photomask with an electrode pattern. A method for forming an electrode with a predetermined shape at a predetermined position of a substrate using photolithography is introduced in, for example, the 2001 FPD Technology Outlook (Electronic Journal, Co., Oct. 25, 2000, pp. 589-594, pp. 601-603, and pp. 604-607).

However, in the above-mentioned photolithography, if undesired dust or the like adheres to the exposure part of the photomask used, the photosensitive material corresponding to the part is not exposed to light and is not polymerized. Consequently, the material is dissoluted when developing, preventing a desired pattern to be achieved. In other words, a so-called "dropout" occurs in the pattern, causing a break in a part of an electrode.

A break in an electrode prevents supplying power to pixels on the downstream of the feed direction depending on a broken position. Such inconvenience and defects are fatal because they cause troubles in image display of a PDP.

The above describes an example for an electrode. In a PDP, despite its large screen, a structure other than an electrode requires accuracy. Consequently, photolithography is used also to form a structure, such as a partition wall, other than an electrode. Such a case also causes the same problems in image display as in an electrode.

Still, in the present invention, a structure of a PDP refers to that formed with photolithography, such as an electrode (e.g. address electrode and display electrode 6), a light-impervious layer, and partition wall 14.

SUMMERY OF THE INVENTION

The present invention, in a manufacturing method for forming a structure of a PDP with photolithography, aims at providing a manufacturing method that prevents defects from occurring in formed structures of the PDP.

In order to achieve the above-mentioned objective, the method of manufacturing a PDP according to the present invention is to form a structure of the PDP using photolithography, where at least one of the above-mentioned structures of the PDP is exposed twice in its forming process, and the photomask is moved between the first and the second exposures within an allowable range of displacement in the exposure pattern.

Further, the method of manufacturing a PDP according to the present invention is to form a structure of the PDP using photolithography, where at least one of the above-mentioned structures of the PDP is exposed twice in its forming process, and the photomask is moved between the first and the second exposures by at least one cycle of the periodicity included in the exposure pattern, and also within an allowable range of displacement in the exposure pattern at the position.

DETAILED DESCRIPTION OF PREFERRED EMBODIMENTS

Hereinafter, a description is made for a method of manufacturing a PDP according to an embodiment of the present invention using drawings.

Figure 1:
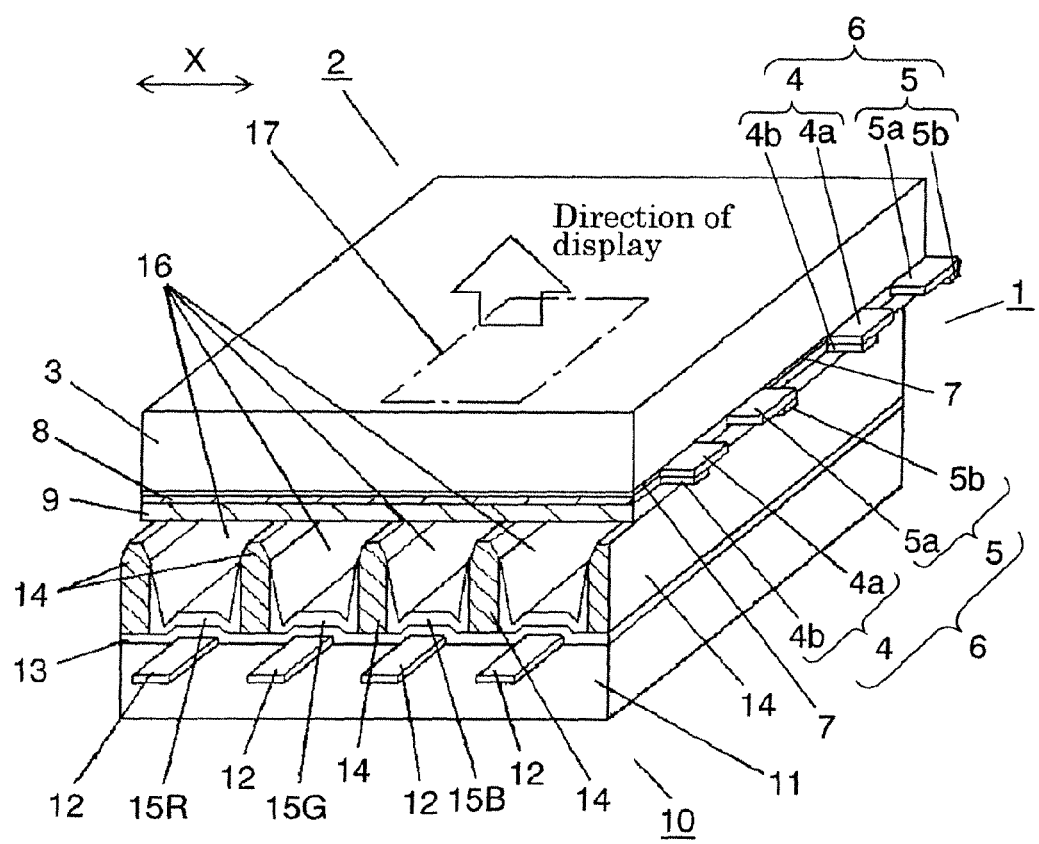
FIG. 1 is a perspective sectional view showing an example of a general makeup of a PDF manufactured with a manufacturing method according to an embodiment of the present invention.

First, a description is made for a structure of a PDP. FIG. 1 is a perspective sectional view showing an example of a general makeup of a PDP manufactured with a manufacturing method according to an embodiment of the present invention.

Front panel 2 of PDP 1 has display electrode 6 including scanning electrode 4 and sustain electrode 5 formed on a main surface of substrate 3, which is smooth, transparent, and insulative, like glass, made with float process or the like; light-impervious layer 7 provided between display electrode 6 and another adjacent one; dielectric layer 8 covering display electrode 6 and light-impervious layer 7; and protective layer 9 further covering dielectric layer 8, containing MgO, for example.

Scanning electrode 4 and sustain electrode 5 are structured so that bus electrodes 4b and 5b are laminated on transparent electrodes 4a and 5a, respectively, made of a highly-conductive material such as a metallic material, in order to reduce electrical resistance. Light-impervious layer 7 shields white light coming from a phosphor layer (described later) when non-emitting, effectively improving contrast.

Back panel 10 has address electrode 12 formed on a main surface of substrate 11, which is smooth, transparent, and insulative, like glass, made with float process or the like, on the back surface; dielectric layer 13 covering the address electrode 12; partition wall 14 arranged at a position corresponding to between address electrode 12 and another adjacent one, on dielectric layer 13; and phosphor layers 15R, 15G, and 15B, between partition wall 14 and another adjacent one.

Front panel 2 and back panel 10 are arranged facing each other across partition wall 14, so that display electrode 6 and address electrode 12 are orthogonal to each other, and the peripheries of front panel 2 and back panel 10 are sealed with a sealing member. In discharge space 16 formed between front panel 2 and back panel 10, a discharge gas (e.g. 5% of Ne—Xe) is encapsulated with a pressure of 66.5 kPa (500 Torr).

The intercept of display electrode 6 and address electrode 12 in discharge space 16 works as discharge cell 17 (a unit of light-emitting region).

Next, a description is made for a method of manufacturing PDP 1 referring to FIG. 1.

In order to manufacture front panel 2, first form scanning electrode 4 and sustain electrode 5 on substrate 3, like stripes for example. Specifically, form a film, which is a material of transparent electrodes 4a and 5a, made of indium tin oxide (ITO) or the like, on substrate 3, using electronic beam evaporation technique, for example. Then pattern a resist on the ITO film so that the resist remains as the pattern for transparent electrodes 4a and 5a. After that, etch transparent electrodes 4a and 5a, which is a well-known method, and then exfoliate the resist to form transparent electrodes 4a and 5a. Still, $SnO_2$ or the like also can be used as the transparent electrode material.

Next, form bus electrodes 4b and 5b on transparent electrodes 4a and 5a. Specifically, use black pigment, glass frit ($PbO$—$B_2O_3$—$SiO_2$ base, $Bi_2O_3$—$B_2O_3$—$SiO_2$ base, etc.), polymerization initiator, photo-sclerotic monomer, and photosensitive black paste containing an organic solvent, for the materials of bus electrodes 4b and 5b.

Then, after forming a black electrode film on the glass substrate with the photosensitive black paste, using screen printing or the like; dry it. Continuously, form a metal electrode film on the black electrode film, using screen printing or the like, with a conducting material containing Ag, glass frit ($PbO$—$B_2O_3$—$SiO_2$ base, $Bi_2O_3$—$B_2O_3$—$SiO_2$ base, etc.), polymerization initiator, photo-sclerotic monomer, photosensitive Ag paste containing an organic solvent; and dry it again. After that, make a pattern with photolithography, and bake it to form bus electrodes 4b and 5b.

The above-mentioned manufacturing method allows forming display electrode 6 including scanning electrode 4 and sustain electrode 5.

Next, form light-impervious layer 7. That is, after forming a film with a photosensitive black paste using screen printing or the like, make a pattern with photolithography, and then bake it. Here, light-impervious layer 7 may be formed concurrently with the base black layers of bus electrodes 4b and 5b. A forming method without using a paste may be exploited as long as the photosensitive paste is black. Still, light-impervious layer 7 may be formed before bus electrodes 4b and 5b are formed.

Next, cover display electrode 6 and light-impervious layer 7 with dielectric layer 8, which is formed by applying a paste containing a lead-based glass material, using screen printing or the like. Then, bake the paste at a predetermined temperature for a predetermined time, at 560° C. for 20 minutes for example, to form dielectric layer 8 with a predetermined thickness, approximately 20 μm, for example.

As a paste containing a lead-based glass material, a mixture of PbO (70 wt %), $B_2O_3$ (15 wt %), $SiO_2$ (10 wt %), and $Al_2O_3$ (5 wt %); and an organic binder (e.g. alpha-terpineol with 10% ethycellulose dissoluted) is used. Here, the organic binder is an organic solvent with a resin dissoluted therein, where, besides ethycellulose, an acrylic resin can be used as the resin; and n-butylcarbitol, for example, can be used as the organic solvent.

Moreover, a dispersing agent such as glyceryl trileate may be mixed in such an organic binder. Still, instead of screen printing using a paste, a molded, film-like dielectric precursor may be laminated and baked to form dielectric layer 8.

Next, cover dielectric layer 8 with protective layer 9. Protective layer 9 includes MgO or the like, as its principal component. Form protective layer 9 so that it has a predetermined thickness, approximately 0.5 μm for example, with a film-forming process such as deposition or sputtering.

Meanwhile, for back panel 10, address electrode 12 is formed on substrate 11, like stripes. Specifically, form a film with screen printing or the like, on substrate 11, using a photosensitive Ag paste for example, to be a material of address electrode 12; make a pattern with photolithography or the like; and bake it to form address electrode 12.

Next, cover address electrode 12 with dielectric layer 13. After applying a paste containing a lead-based glass material, with screen printing or the like, bake the paste at a predetermined temperature for a predetermined time, at 560° C. for 20 minutes for example, to form dielectric layer 13 with a predetermined thickness, approximately 20 μm.

Instead of screen-printing using a paste, a molded, film-like base dielectric layer precursor may be laminated and baked to form dielectric layer 13.

Next, form partition wall 14 like stripes, for example. Form a film with a photosensitive paste having an aggregate such as $Al_2O_3$, and glass frit as it base resin, with a printing method, die coating, or the like; make a pattern with photolithography; and bake it to form partition wall 14. Alternatively, forming may be performed, after repeatedly applying a paste containing a lead-based glass material, with screen printing or the like, at a predetermined pitch, by baking it. Here, the gap between partition walls 14 is approximately 130 μm to 240 μm for a HDTV set with its screen size of 32 to 50 inches, for example.

In the groove between partition wall 14 and another adjacent one, form phosphor layers 15R, 15G, and 15B composed of the respective phosphor particles red (R), green (G), and blue (B). In order to form these layers, apply a phosphor ink paste including phosphor particles with each color and an organic binder; and bake it at 400° C. to 590° C., for example, to burn out the organic binder. This forms phosphor layers 15R, 15G, and 15B with each phosphor particle binding.

Lay front panel 2 and back panel 10 so that display electrode 6 on front panel 2 and address electrode 12 on back panel 10 are orthogonal to each other; insert a sealing member such as sealing glass to the peripheries of front panel 2 and back panel 10; and seal them with a hermetic seal layer (not illustrated) formed by baking it at approximately 450° C. and for 10 to 20 minutes, for example. Then, after once exhausting discharge space 16 with a high vacuum, $1.1*10{-4}$ Pa for example, encapsulate a discharge gas (e.g. a He—Xe-based or Ne—Xe-based inert gas) with a predetermined pressure to produce PDP 1.

While PDP 1 in this case has a large screen, a structure of PDP 1, such as display electrode 6, light-impervious layer 7, address electrode 12, and partition wall 14, requires accuracy in its shape and position; and thus photolithography is widely used for a method of forming such a structure.

Hereinafter, a description is made for photolithography, namely a method of manufacturing a PDP according to the present invention, taking address electrode 12, namely a structure of PDP 1, for example, mainly about the exposure process, namely a feature of the present invention, using drawings. FIGS. 2A through 2D illustrate a general flow of the process to form address electrode 12, which is a structure of PDP1.

Figure 2A:
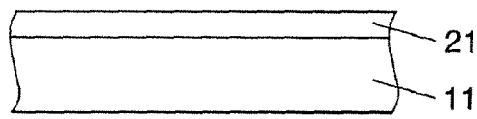
FIGS. 2A through 2D illustrate a flow of a process to form an address electrode, which is a structure of a PDP according to the present invention.

First, as shown in FIG. 2A, apply a uniform coating of a photosensitive Ag paste with screen printing or the like, to form photosensitive Ag paste film 21 on substrate 11.

Figure 2B:
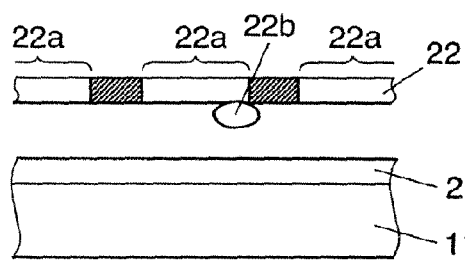

Next, as shown in FIG. 2B, arrange photomask 22 including an exposure pattern for making address electrode 12 shown in FIG. 1 with photolithography, positioning at a predetermined position on substrate 11. In FIG. 2B, the unhatched area of photomask 22 is an open part, becoming exposure part 22a. In addition, in order to describe the features of the present invention, as a matter of convenience, an assumption has been made that undesired dust 22b remains attached to a part of photomask 22.

Figure 2C:
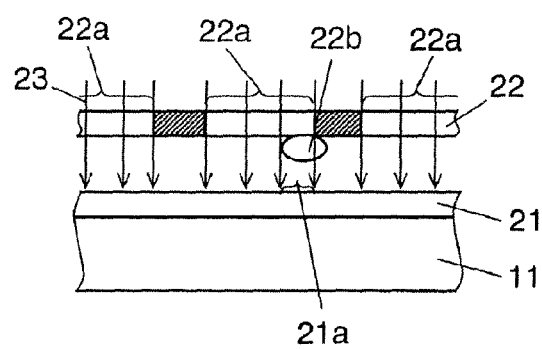

Next, as shown in FIG. 2C, perform a first exposure on photosensitive Ag paste film 21 through photomask 22. Specifically, irradiate photomask 22 with ultraviolet light 23 from an extra-high-pressure mercury lamp. Here, if it is assumed that undesired dust 22b remains attached to open part 22a of photomask 22, region 21a, a position of photosensitive Ag paste film 21 corresponding to dust 22b, is not to be exposed to light.

Next, move photomask 22 within an allowable range of displacement in the exposure pattern to perform a second exposure. That is, in the process of forming address electrodes, which are structures of PDP 1, perform an exposure process twice.

Still, the above-mentioned allowable range of displacement in the exposure pattern is defined by accuracy both in shape and position of electrode 12 shown in FIG. 1. Next, an example of how to move photomask 22 is shown in FIGS. 3A through 3C with the positional relationship between open part 22a and dust 22b before and after moving photomask 22.

Figure 3A:
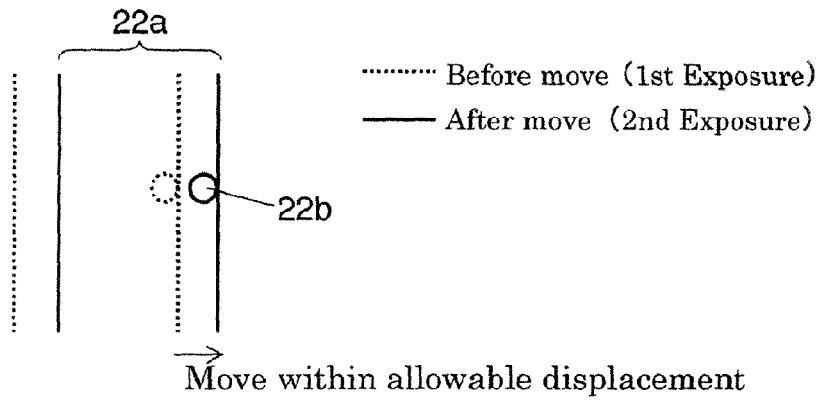
FIGS. 3A through 3C illustrate an example of how to move a photomask.

FIG. 3A shows a method of the second exposure (shown by solid lines) in which a position slightly moved from that of photomask 22 in the first exposure (shown by broken lines) is exposed within an allowable range of displacement in the exposure pattern.

Figure 3B:
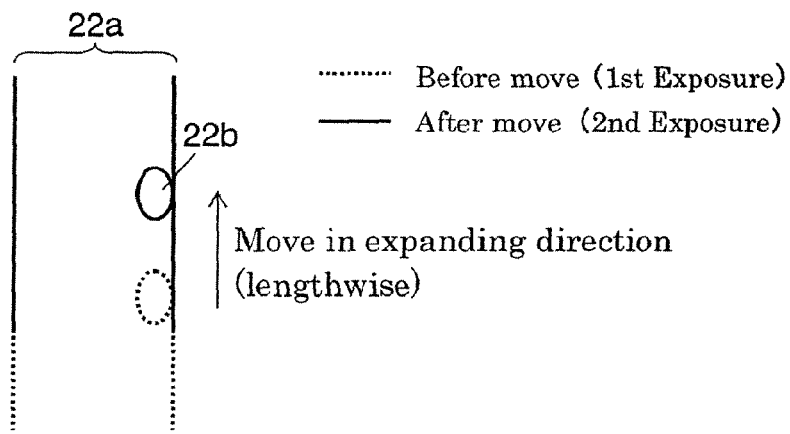

Further, FIG. 3B shows a case, if address electrodes 12 are like stripes, where after a first exposure shown by broken lines is performed, a second exposure is performed as shown by solid lines. This is a method in which the width direction is within an allowable range of displacement in the exposure pattern in the second exposure, and the exposed position is moved in its direction of expansion (lengthwise in the pattern).

Figure 3C:
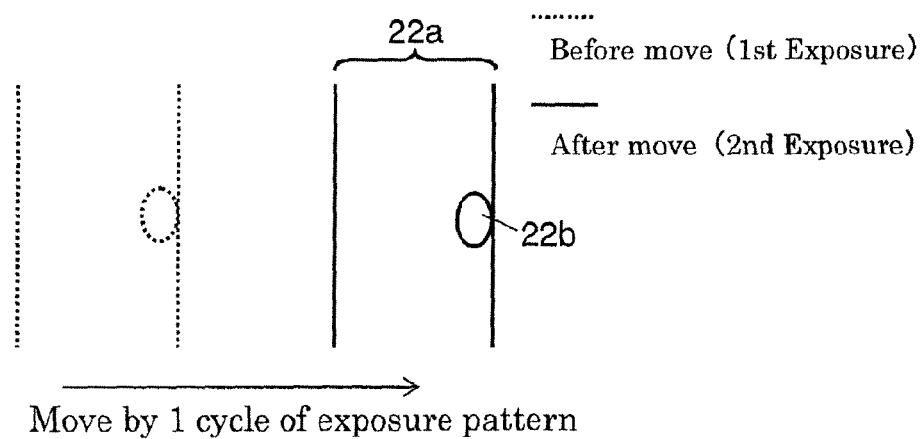

In addition, generally, address electrode 12 shown in FIG. 1 is allocated with periodicity due to the makeup of a PDP, and thus as shown in FIG. 3C, a method may be adopted in which photomask 22 is moved by at least one cycle of the exposure pattern, as long as within an allowable range of displacement in the exposure pattern. Still, a structure of PDP 1 composes discharge cell 17, which becomes a pixel, and therefore the allocation pattern of a structure of PDP 1 usually has periodicity.

Figure 2D:
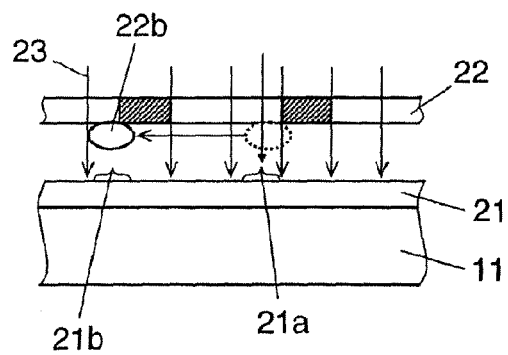

Moving of photomask 22 shown in FIG. 2D is effective if dust 22b is assumed smaller than an allowable range of displacement in the exposure pattern. Meanwhile, the cases shown in FIG. 3B and FIG. 3C are effective if dust 22b is assumed greater than that.

Here, FIG. 2D shows a state in which photomask 22 has been moved by one cycle to the left direction from the state of FIG. 2C, shown in FIG. 3C, looking straight at FIG. 2D from the front. That is, move photomask 22 within an allowable range of displacement in the exposure pattern to perform a second exposure. In this case, because undesired dust 22b was temporarily attached to the exposure part of photomask 22, even if region 21a, a position of photosensitive Ag paste film 21 corresponding to dust 22b, is not exposed in the first exposure, region 21a changes in the second exposure. Consequently, region 21a, not exposed in the first exposure, is to be exposed.

In the second exposure, although region 21b, a region not exposed due to interruption of dust, newly occurs at a position displaced by one cycle of the exposure pattern, region 21b has been already exposed in the first exposure. In other words, if photomask 22 is moved, dust attaches at the same position of photosensitive Ag paste film 21 before and after moving with a very low probability.

Therefore, as long as photomask 22 is exposed twice in total before and after moving photomask 22, an unexposed region due to interruption of dust 22b attached to photomask 22 can be prevented from occurring. That is, pattern exposure is favorably performed on photosensitive Ag paste film 21. Additionally, accuracy in the exposed pattern falls within the allowable range of error.

Finally, developing photosensitive Ag paste film 21 exposed with the pattern of address electrode 12 in the above way, makes photosensitive Ag paste film 21 the pattern of address electrode 12; and baking it completes address electrode 12.

Although the above description is made for address electrode 12 as an example of a structure of PDP 1, such a structure mentioned above refers to that formed with photolithography, such as display electrode 6, light-impervious layer 7, partition wall 14, and the like. Even for at least one of these structures, the above-mentioned effect can be achieved by applying the present invention in the forming process.

INDUSTRIAL APPLICABILITY

The present invention provides, in a method of forming a structure of a PDP with photolithography, a method of manufacturing a PDP and the PDP to be manufactured therewith that prevent defects, due to dust adhering to a photomask, for example, from occurring in the structure of the PDP, offering a high industrial applicability.

REFERENCE NUMERALS IN THE DRAWINGS

11 Substrate
21 Photosensitive Ag-paste film
21a, 21b Region
22 Photomask
22a Exposure part
22b Dust

The invention claimed is:
1. A method of manufacturing a plasma display panel, in which a plurality of structures of the plasma display panel are formed with photolithography, wherein a position on a photosensitive material corresponding to one of the structures of the plasma display panel is exposed twice using successive first and second exposures, each of the structures extends primarily in a lengthwise direction and has a width w in a widthwise direction orthogonal to the lengthwise direction, and a photomask and the photosensitive material are moved in the widthwise direction relative to each other by a distance less than w between the first and second exposures.

2. The method according to claim 1, wherein the structures are address electrodes formed by exposing a photosensitive silver paste polymerized by exposure to light.

3. A method of manufacturing a plasma display panel, in which a plurality of electrodes, disposed periodically with a pitch p, of the plasma display panel are formed with photolithography, wherein a position on a photosensitive material corresponding to one of the electrodes is exposed twice using successive first and second exposures, exposure parts of a photomask for forming the electrodes are disposed periodically with the pitch p, and a photomask and the photosensitive material are moved relative to each other by two or more integral times the distance p between the first and second exposures.

4. The method according to claim 3, wherein the electrodes are address electrodes formed by exposing a photosensitive silver paste polymerized by exposure to light.

* * * * *